United States Patent
Liu et al.

(10) Patent No.: US 11,177,287 B2
(45) Date of Patent: Nov. 16, 2021

(54) THIN FILM TRANSISTOR, FABRICATION METHOD THEREFOR, AND ARRAY SUBSTRATE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Xiaowei Liu, Beijing (CN); Bo Liu, Beijing (CN); Zhonghao Huang, Beijing (CN); Chao Fan, Beijing (CN); Yang Wang, Beijing (CN); Yabin An, Beijing (CN); Zheng Liu, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 16/333,032

(22) PCT Filed: Apr. 27, 2018

(86) PCT No.: PCT/CN2018/084847
§ 371 (c)(1),
(2) Date: Mar. 13, 2019

(87) PCT Pub. No.: WO2018/219084
PCT Pub. Date: Dec. 6, 2018

(65) Prior Publication Data
US 2019/0267406 A1     Aug. 29, 2019

(30) Foreign Application Priority Data

May 27, 2017   (CN) .......................... 201710392164.7

(51) Int. Cl.
*H01L 29/786*   (2006.01)
*H01L 29/423*   (2006.01)
(Continued)

(52) U.S. Cl.
CPC ........ *H01L 27/1225* (2013.01); *H01L 27/124* (2013.01); *H01L 27/1259* (2013.01);
(Continued)

(58) Field of Classification Search
CPC ............ H01L 27/124; H01L 29/41733; H01L 27/1262
See application file for complete search history.

(56) References Cited

U.S. PATENT DOCUMENTS

2006/0175609 A1*   8/2006   Chan ................. H01L 29/66787
                                                    257/59
2010/0133539 A1*   6/2010   Kang ..................... H01L 27/12
                                                    257/59
(Continued)

FOREIGN PATENT DOCUMENTS

CN     102315214 A     1/2012
CN     103311310 A     9/2013
(Continued)

OTHER PUBLICATIONS

International Search Report and Written Opinion dated Jul. 18, 2018; PCT/CN2018/084847.

*Primary Examiner* — Eduardo A Rodela
*Assistant Examiner* — Christopher M Roland (57) ABSTRACT

The present disclosure provides a thin film transistor and a fabrication method thereof, and an array substrate. The thin film transistor formed on a base substrate, the thin film transistor includes: an active layer; a first signal metal layer, provided on a surface of the active layer facing the base substrate; a second signal metal layer, provided on a surface
(Continued)

of the active layer facing away from the first signal metal layer, wherein, the active layer includes a conductive channel formation region, and the second signal metal layer does not cover the conductive channel formation region of the active layer.

17 Claims, 5 Drawing Sheets

(51) Int. Cl.
    *H01L 29/417*     (2006.01)
    *H01L 27/12*     (2006.01)

(52) U.S. Cl.
    CPC .... *H01L 27/1262* (2013.01); *H01L 29/41733* (2013.01); *H01L 29/42384* (2013.01); *H01L 29/7869* (2013.01); *H01L 29/78633* (2013.01); *H01L 29/78642* (2013.01); *H01L 29/78696* (2013.01)

(56) References Cited

U.S. PATENT DOCUMENTS

| | | | | |
|---|---|---|---|---|
| 2012/0270383 A1* | 10/2012 | Abe | ........................ | H01L 29/04 |
| | | | | 438/479 |
| 2013/0001573 A1* | 1/2013 | Lee | ......................... | H01L 29/45 |
| | | | | 257/60 |
| 2014/0239286 A1* | 8/2014 | Yasuda | .................. | H01L 27/283 |
| | | | | 257/40 |
| 2016/0225914 A1 | 8/2016 | Zhang et al. | | |
| 2016/0300899 A1 | 10/2016 | Zhang | | |
| 2017/0025308 A1* | 1/2017 | Matsumoto | ....... | H01L 21/76879 |
| 2017/0117302 A1* | 4/2017 | Zhang | ................. | H01L 27/1225 |
| 2018/0204856 A1* | 7/2018 | Noh | ...................... | H01L 27/124 |

FOREIGN PATENT DOCUMENTS

| | | | | |
|---|---|---|---|---|
| CN | 104681629 A | * | 6/2015 | ......... H01L 27/1225 |
| CN | 104779272 A | | 7/2015 | |
| CN | 106024906 A | | 10/2016 | |
| CN | 106972034 A | | 7/2017 | |

* cited by examiner

THIN FILM TRANSISTOR, FABRICATION METHOD THEREFOR, AND ARRAY SUBSTRATE

TECHNICAL FIELD

The present disclosure relates to a thin film transistor and a fabrication method thereof, and an array substrate.

BACKGROUND

In recent years, with development of large-sized liquid crystal displays and active organic light emitting diodes, it is difficult for traditional amorphous silicon thin film transistors and organic thin film transistors to meet needs of users, while a transparent amorphous oxide semiconductor represented by indium gallium zinc oxide (IGZO) is widely used in an active layer of an oxide thin film transistor, due to advantages such as high mobility, good uniformity and transparency, so that the oxide thin film transistor can satisfy the users' needs for a new generation of display.

SUMMARY

The present disclosure provides a thin film transistor and a fabrication method thereof, and an array substrate, which can reduce a size of the thin film transistor and improve the yield of the thin film transistor.

At a first aspect, the present disclosure provides a thin film transistor formed on a base substrate, the thin film transistor comprising: an active layer; a first signal metal layer, provided on a surface of the active layer facing the base substrate; a second signal metal layer, provided on a surface of the active layer facing away from the first signal metal layer, wherein, the active layer includes a conductive channel formation region, and the second signal metal layer does not cover the conductive channel formation region of the active layer.

At a second aspect, the present disclosure provides a fabrication method of a thin film transistor, comprising: providing a base substrate, and forming a first signal metal layer on the base substrate; forming an active layer and a second signal metal layer on the base substrate on which the first signal metal layer is formed, wherein, the second signal metal layer is provided on a surface of the active layer facing away from the first signal metal layer, and the second signal metal layer does not cover a conductive channel formation region of the active layer.

At a third aspect, the present disclosure provides an array substrate, comprising the thin film transistor according to the first aspect.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Embodiments of the present disclosure be in detail described hereinafter, and examples of the embodiments are shown in the drawings, in which the same or similar reference number is denoted as the same or similar members or the members with the same or similar function throughout. The described embodiments in conjunction with the accompanying drawings of the present disclosure are exemplary, only is used to explain the present disclosure and do not intend to limit the present disclosure.

In the description, the description with referring to the terms "an embodiment", "some embodiments", "example", "specific example" or "some examples" means that the specific feature, structure, material or character described with connection with the embodiment or example is included in at least one embodiment or example of the present disclosure. In the description, the schematic description of the above terms is not necessary to direct to the same embodiment or example. The described feature, structure, material or character may be combined in any suitable manner in any or a plurality of embodiments or examples. Further, in case of no conflict, different embodiments or examples and features in different embodiments or example described in the specification can be combined.

Further, the terms, such as "first," "second," or the like, which are used in the description and the claims of the present disclosure, are not intended to indicate or imply the relative importance or implicitly indicate the amount of the features. Thus, the features defined by "first," "second," may explicitly indicate or implicitly includes at least one feature. In the description of the present disclosure, unless otherwise defined, "a plurality of" means two or more.

There are mainly two types of oxide thin film transistors below, of which one is a thin film transistor of an Etching Stop Layer (ESL) type, and the other is a thin film transistor of a Back Channel Etched (BCE) type.

Figure 1:
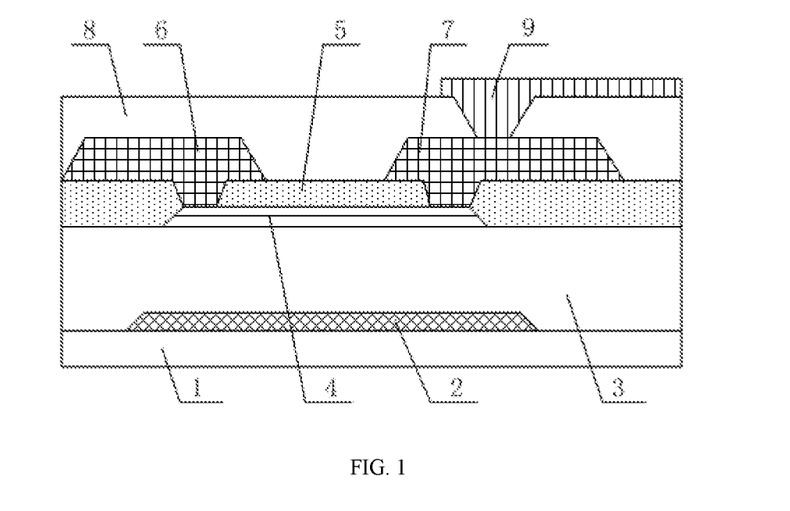
FIG. 1 is an exemplary structural schematic diagram of an oxide thin film transistor.

Wherein, a structure of the ESL thin film transistor is as shown in FIG. 1, and a fabrication thereof usually requires forming an etching stop layer 5 on an active layer 4, and forming two via holes respectively corresponding to a source electrode 6 and a drain electrode 7 in the etching stop layer 5 by using a photomask process, and then forming the source electrode 6 and the drain electrode 7 on the etching stop layer 5, so that the source electrode 6 and the drain electrode 7 are respectively connected with the active layer 4 through the corresponding via holes in the etching stop layer 5. When the two via holes are formed in the etching stop layer 5, apertures of the via holes should be enlarged as far as possible, so as to enable good connections of the source electrode 6 and the drain electrode 7 with the active layer 4, but accurate alignment of the two via holes with the active layer 4 is also required, so as to ensure that the source electrode 6 and the drain electrode 7 are connected with the active layer 4 through the corresponding via holes. However, the via hole has a relatively large aperture and a space is left between the two via holes, so in order to ensure accurate alignment of the via holes with the active layer 4, the active layer 4 needs to have a sufficient size.

Figure 2:
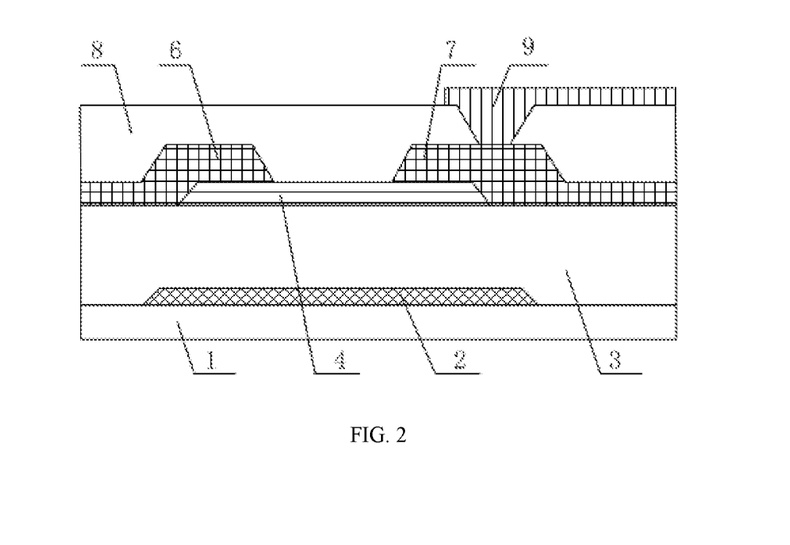
FIG. 2 is an exemplary structural schematic diagram of an oxide thin film transistor.

A structure of the BCE thin film transistor is as shown in FIG. 2; since the source electrode 6, the drain electrode 7 and the active layer 4 are provided in a same layer, the source electrode 6 and the drain electrode 7 may be directly connected with the active layer 4, without forming via holes for connecting the source electrode 6 and the drain electrode 7 to the active layer 4. Therefore, as compared with the ESL thin film transistor, a fabrication process of the BCE thin film transistor is slightly simpler, and there is no size limitation requirement on the active layer 4, so that the BCE thin film transistor may overcome the above-described problem that the ESL thin film transistor cannot be miniaturized. However, since the source electrode 6, the drain electrode 7 and the active layer 4 of the BCE thin film transistor are provided in the same layer, during a procedure of etching to form the source electrode 6 and the drain electrode 7, an etching solution of the source electrode 6 and the drain electrode 7 is apt to corrode and damage a previously formed conductive channel of the active layer 4; and after the source electrode 6 and the drain electrode 7 are etched, when the conductive channel of the active layer 4 is subjected to a plasma oxidation treatment, etched metal surfaces of the source electrode 6 and the drain electrode 7 are also susceptible to be oxidized by influence of the plasma oxidation treatment. Therefore, in a fabrication procedure of the BCE thin film transistor, it is likely to occur that the conductive channel of the active layer 4 is corroded and damaged, or the source electrode 6 and the drain electrode 7 are oxidized, or the conductive channel of the active layer 4 is corroded and damaged and the source electrode 6 and the drain electrode 7 are oxidized.

In order to further explain a thin film transistor and a fabrication method thereof, and an array substrate provided by embodiments of the present disclosure, detailed description will be provided below in conjunction with the accompanying drawings.

Figure 3:
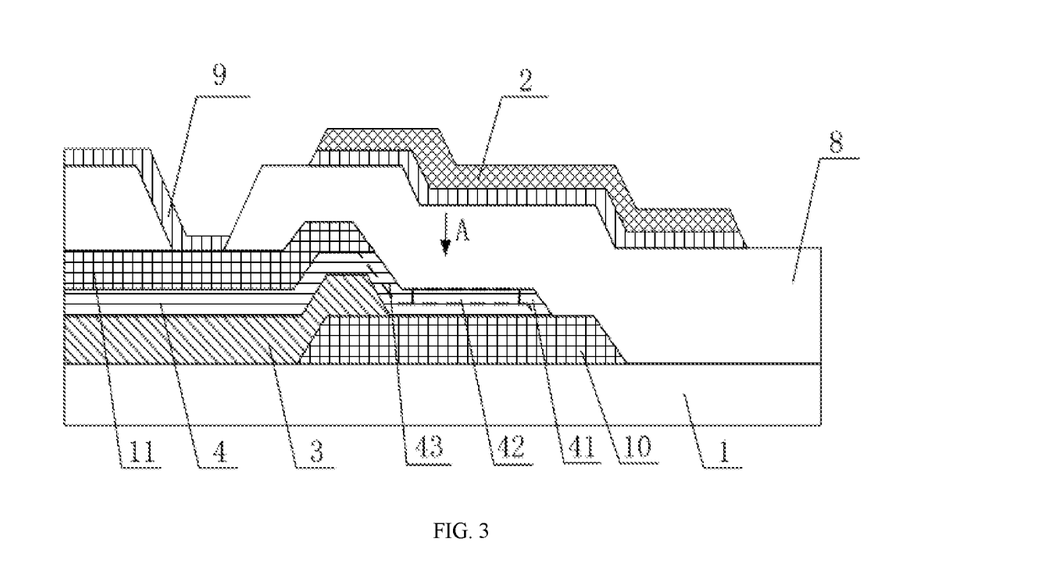
FIG. 3 is a structural schematic diagram of a thin Film transistor provided by an embodiment of the present disclosure.
Figure 4:
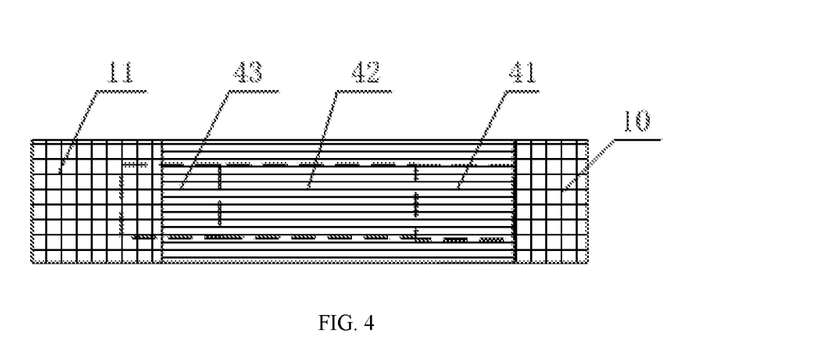
FIG. 4 is a schematic top view of an active layer in an A direction provided by an embodiment of the present disclosure.

With reference to FIG. 3 and FIG. 4, a thin film transistor provided by an embodiment of the present disclosure is formed on a base substrate 1, the thin film transistor comprising a gate electrode 2 and an active layer 4; a first signal metal layer 10 provided on a surface of the active layer 4 facing the base substrate 1, and a second signal metal layer 11 provided on a surface of the active layer 4 facing away from the first signal metal layer 10; wherein, the active layer 4 includes a conductive channel formation region 42, and the second signal metal layer 11 does not cover the conductive channel formation region 42 of the active layer 4.

Exemplarily, an orthogonal projection of the first signal metal layer 10 on the base substrate 1 is located on a side of an orthogonal projection of the conductive channel formation region 42 on the base substrate 1.

For example, the second signal metal layer 11 and the first signal metal layer 10 are respectively stacked on an upper surface and a lower snake of the active layer 4, so that the second signal metal layer 11 and the first signal metal layer 10 are respectively directly connected with the active layer 4. An exemplary fabrication method is that: when the thin film transistor is fabricated, the first signal metal layer 10 may be formed on the base substrate 1 in advance, the active layer 4 is formed on the first signal metal layer 10, and then the second signal metal layer 11 is formed on the upper surface of the active layer 4 facing away from the first signal metal layer 10, in such a manner that the second signal metal layer 11 does not cover the conductive channel formation region 42 of the active layer 4, that is, the second signal metal layer 11 and the conductive channel formation region 42 of the active layer 4 are staggered in different layers; and after the second signal metal layer 11 is formed, it is also necessary to perform a plasma oxidation treatment on the conductive channel formation region 42 of the active layer 4, so as to enhance stability in the use of the thin film transistor. Another exemplary fabrication method is that: the active layer 4 and the second signal metal layer 11 may be formed by a same patterning process.

It may be known through the above-described specific implementation procedure that, the thin film transistor provided by the embodiment of the present disclosure has the second signal metal layer 11 and the first signal metal layer 10 respectively stacked on the upper surface and the lower surface of the active layer 4, and the second signal metal layer 11 and the first signal metal layer 10 directly connected with the active layer 4, respectively, such that the second signal metal layer 11 and the first signal metal layer 10 are connected to the active layer 4 without via holes, and therefore, in the thin film transistor provided by the embodiment of the present disclosure, without any size limitation of the via hole, the active layer 4 may be downsized as much as possible, so as to miniaturize the thin film transistor.

Moreover, in the thin film transistor provided by the embodiment of the present disclosure, the second signal metal layer 11 and the conductive channel formation region 42 of the active layer 4 are staggered in different layers; when the second signal metal layer 11 is formed, a separation distance between the second signal metal layer 11 and the conductive channel formation region 42 of the active layer 4 staggered in different layers may prevent an etching solution for etching the second signal metal layer 11 from splashing onto the conductive channel formation region 42 of the active layer 4, so as to avoid corrosion damage to the conductive channel formation region 42 of the active layer 4; and after the second signal metal layer 11 is formed, when the conductive channel formation region 42 of the active layer 4 is subjected to the plasma oxidation treatment, due to the separation distance between the second signal metal layer 11 and the conductive channel formation region 42 of the active layer 4 staggered in different layers, coverage range of the plasma oxidation treatment may not involve or rarely involve the second signal metal layer 11, so as to ensure that a surface of the second signal metal layer 11 is not oxidized or only has a very small portion oxidized. Therefore, in the thin film transistor provided by the embodiment of the present disclosure, the separation distance between the second signal metal layer 11 and the conductive channel formation region 42 of the active layer 4 staggered in different layers may effectively avoid a case where the conductive channel formation region 42 of the active layer 4 is corroded and damaged, and the surface of the second signal metal layer 11 is oxidized, and prevent a conductive performance of the thin film transistor from being affected, which is favorable for improving a yield of the thin film transistor.

In addition, it may be understood that, in the above-described embodiment, a signal metal layer located on a same side as the conductive channel 42 of the active layer 4 is defined as the second signal metal layer 11, and a signal metal layer located on the other side of the active layer 4 is defined as the first signal metal layer 10, which is intended to more clearly explain a connection relationship of respective composition structures in the thin film transistor, without any other substantive limitation. Wherein, the first signal metal layer 10 may serve as a source electrode of the thin film transistor, or may also serve as a drain electrode of the thin film transistor; when the first signal metal layer 10 serves as the source electrode, the second signal metal layer 11 serves as the drain electrode correspondingly, and when the first signal metal layer 10 serves as the drain electrode, the second signal metal layer 11 serves as the source electrode correspondingly.

It should be noted that, the thin film transistor may be generally classified into a P-channel thin film transistor or an N-channel thin film transistor according to a type of its conductive channel. Exemplarily, with reference to FIG. 4, the active layer 4 includes a first base region 41, a second base region 43, and the conductive channel formation region 42 located between the first base region 41 and the second base region 43, wherein, the first base region 41 of the active layer 4 is used for being connected with the first signal metal layer 10, and the second base region 43 of the active layer 4 is used for being corrected with the second signal metal layer 11. When the thin film transistor is a P-channel thin film transistor, the first base region 41 and the second base region 43 are respectively P regions, and under a voltage action of a gate electrode of the thin film transistor, the conductive channel formation region 42 of the active layer 4 may turn on between the first base region 41 and the second base region 43, to form a P channel. When the thin film transistor is an N-channel thin film transistor, the first base region 41 and the second base region 43 are respectively N regions, and under a voltage action of the gate electrode of the thin film transistor, the conductive channel formation region 42 of the active layer 4 may turn on between the first base region 41 and the second base region 43, to form an N channel.

Exemplarily, the active layer may cover a portion of the first signal metal layer or the entire first signal metal layer.

It is worth mentioning that, in the above-described embodiment, the orthogonal projection of the first signal metal layer 10 on the base substrate 1 is staggered or partially overlapped with an orthogonal projection of the second signal metal layer 11 on the base substrate 1, which is manifested as follows: the active layer 4 covers the first signal metal layer 10; on a side of the active layer 4 facing away from the first signal metal layer 10, the second signal metal layer 11 is formed on a surface of the active layer 4 not directly facing the first signal metal layer 10; in this way, on the surface of the active layer 4 facing away from the first signal metal layer 10, there will be the conductive channel formation region 42 which may be used for forming, the conductive channel of the active layer 4 in such a manner that the second signal metal layer 11 does not cover the conductive channel formation region 42 of the active layer 4, and there is a separation distance between the second signal metal layer 11 and the conductive channel formation region 42 of the active layer 4 staggered in different layers.

As compared with a case where the source electrode 6 and the drain electrode 7 of the ESL, thin film transistor or the BCE thin film transistor are located in a same layer, in this embodiment, the second signal metal layer 11 and the first signal metal layer 10 are respectively formed in different layer structures; when the orthogonal projection of the second signal metal layer 11 on the base substrate 1 is partially coincident with the orthogonal projection of the first signal metal layer 10 on the base substrate 1, the first signal metal layer 10 and the second signal metal layer 11 have an area used for shading reduced correspondingly, so that an aperture ratio of the thin film transistor may be increased. In addition, the orthogonal projection of the second signal metal layer 11 on the base substrate 1 is staggered or partially coincident with the orthogonal projection of the first signal metal layer 10 on the base substrate 1, which may further appropriately reduce a capacitance formed as the two signal metal layers are provided opposite to each other, and improve an electrical performance of the thin film transistor, so as to improve a display quality of a display panel where the thin film transistor is located.

It is worth mentioning that, in the above-described embodiment, a first insulating layer 3 is provided between the active layer 4 and the base substrate 1; and the first insulating layer 3 is provided in a same layer as the first signal metal layer 10, so that the first insulating layer 3 and the first signal metal layer 10 collectively support the active layer 4. Moreover, a formation structure of the first insulating layer 3 may assist in defining formation structures of the active layer 4 and the second signal metal layer 11; so, a portion of the first insulating layer 3 is stacked on the first signal metal layer 10, so that the portion of the first insulating layer 3 is a trapezoidal protrusion, which assists in defining the formation structures of the active layer 4 and the second signal metal layer 11, to ensure that the active layer 4 and the second signal metal layer 11 may be staggered in different layers in a single patterning process, which, thus, simplifies a fabrication process of the thin film transistor.

It should be added that, in the thin film transistor provided by the above-described embodiment, a second insulating layer 8 is provided between the active layer 4 and the gate electrode 2, between the first signal metal layer 10 and the gate electrode 2, and between the second signal metal layer 11 and the gate electrode 2, so that the gate electrode 2 is insulated from the active layer 4, the gate electrode 2 is insulated from the first signal metal layer 10, and the gate electrode 2 is insulated from the second signal metal layer 11, to ensure stability in the use of the thin film transistor.

In order to further simplify the fabrication process of the thin film transistor, in the above-described embodiment, a via hole is provided in a region of the second insulating layer 8 corresponding to the second signal metal layer 11, and a pixel electrode 9 is disposed on the second insulating layer 8; the pixel electrode 9 is provided in a same layer as the gate electrode 2, and the pixel electrode 9 is connected with the second signal metal layer 11 through the via hole. Since the pixel electrode 9 is provided in the same layer as the gate electrode 2, the pixel electrode 9 and the gate electrode 2 may be formed in one patterning process, which may further reduce the total number of patterning processes used in a fabrication procedure of the thin film transistor, so as to further simplify the fabrication process of the thin film transistor and improve a fabrication efficiency of the thin film transistor. It should be noted that, although the pixel electrode 9 and the gate electrode 2 are provided in the same layer, the pixel electrode 9 and the gate electrode 2 are independent of each other, that is, there is no connection between the pixel electrode 9 and the gate electrode 2.

In order to improve a device performance of the thin film transistor, in the above-described embodiment, the gate electrode 2 is located on a side of the second insulating layer 8 facing away from the active layer 4, and an orthogonal projection of the gate electrode 2 on the base substrate 1 covers the orthogonal projection of the conductive channel formation region 42 of the active layer 4 on the base substrate 1. Thus, the gate electrode 2 can block light for the conductive channel formation region 42 of the active layer 4, prevent light from being incident to the conductive channel formation region 42 of the active layer 4 from a side of the active layer 4 facing away from the base substrate 1, and avoid an electrical performance of the conductive channel formation region 42 of the active layer 4 from being affected by illumination, for example, avoid threshold voltage shift of the thin film transistor, so as to improve the electrical performance of the thin film transistor and enhance control stability of the thin film transistor.

The thin film transistor provided by the present disclosure has advantageous effects below:

In the thin film transistor provided by the present disclosure, the first signal metal layer is provided on the surface of the active layer facing the base substrate 1, and the second signal metal layer is provided on the surface of the active layer facing away from the first signal metal layer, that is, the second signal metal layer and the first signal metal layer are respectively stacked on the upper surface and the lower surface of the active layer, and the second signal metal layer and the first signal metal layer are directly connected with the active layer, respectively, such that the second signal metal layer and the first signal metal layer are connected to the active layer without via holes, and therefore, in the thin film transistor provided by the present disclosure, without any size limitation of the via hole, the active layer may be downsized as much as possible, so as to miniaturize the thin film transistor.

Moreover, in the thin film transistor provided by the present disclosure, although the second signal metal layer is located on the upper surface of the active layer, the second signal metal layer does not cover the conductive channel formation region of the active layer, so that the second signal metal layer and the conductive channel formation region of the active layer are staggered in different layers; and when the second signal metal layer is formed, the separation distance between the second signal metal layer and the conductive channel limitation region of the active layer staggered in different layers may prevent the etching solution for etching the second signal metal layer from splashing onto the conductive channel formation region of the active layer, so as to avoid corrosion damage to the conductive channel formation region of the active layer; and after the second signal metal layer is formed, when the conductive channel formation region of the active layer is subjected to the plasma oxidation treatment, clue to the separation distance between the second signal metal layer and the conductive channel formation region of the active layer staggered in different layers, coverage of the plasma oxidation treatment may not involve or rarely involve the second signal metal layer, so as to ensure that the surface of the second signal metal layer is not oxidized or only has a very small portion oxidized. Therefore, in the thin film transistor provided by the present disclosure, the separation distance between the second signal metal layer and the conductive channel formation region of the active layer staggered in different layers may effectively avoid a case Where the conductive channel formation region of the active layer 4 is corroded and damaged, and the surface of the second signal metal layer is oxidized, and prevent a conductive performance of the thin film transistor from being affected, which is favorable for improving a yield of the thin film transistor.

Figure 5:
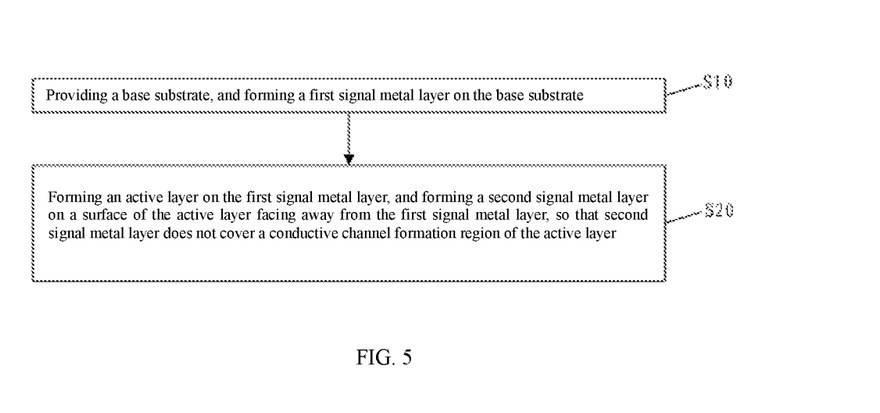
FIG. 5 is a flow chart I of a fabrication method of a thin film transistor provided by an embodiment of the present disclosure.

An embodiment of the present disclosure further provides a fabrication method of a thin film transistor, for fabricating the thin film transistor according to the above-described embodiment; with reference to FIG. 3 to FIG. 5 and FIG. 9, the fabrication method of the thin film transistor comprising:

S10: providing a base substrate 1, and forming a first signal metal layer 10 on the base substrate 1;

S20: forming an active layer 4 and a second signal metal layer 11 on the base substrate 1 on which the first signal metal layer 10 is formed, wherein, the second signal metal layer 11 is provided on a surface of the active layer 4 facing away from the first signal metal layer 10, and the second signal metal layer 11 does not cover a conductive channel formation region 42 of the active layer 4.

Exemplarily, an orthogonal projection of the first signal metal layer on the base substrate is located on a side of an orthogonal projection of the conductive channel formation region.

Advantageous effects that may be achieved by the fabrication method of the thin film transistor provided by the embodiment of the present disclosure are the same as those of the thin film transistor provided by the above-described technical solution, which will not be repeated here.

It should be noted that, in this embodiment, when the second signal metal layer 11 is formed on the surface of the active layer 4 facing away from the first signal metal layer 10, in order to ensure that the second signal metal layer 11 and the conductive channel formation region 42 of the active layer 4 are staggered in different layers, the second signal metal layer 11 is usually formed on a surface of the active layer 4 not directly facing the first signal metal layer 10, on a side of the active layer 4 facing away from the first signal metal layer 10, so that an orthogonal projection of the second signal metal layer 11 on the base substrate 1 is staggered or partially coincident with the orthogonal projection of the first signal metal layer 10 on the base substrate 1. Thus, on the surface of the active layer 4 facing away from the first signal metal layer 10, there is the conductive channel formation region 42 which may be used for forming a conductive channel of the active layer 4 in such a manner that the second signal metal layer 11 does not cover the conductive channel formation region 42 of the active layer 4, and there is a separation distance between the second signal metal layer 11 and the conductive channel formation region 42 of the active layer 4 staggered in different layers.

Moreover, as compared with a case where a source electrode 6 and a drain electrode 7 of an ESL thin film transistor or a BCE thin film transistor are located in a same layer, in this embodiment, the second signal metal layer 11 and the first signal metal layer 10 are respectively formed in different layer structures; when the orthogonal projection of the second signal metal layer 11 on the base substrate 1 is partially coincident with the orthogonal projection of the first signal metal layer 10 on the base substrate 1, the first signal metal layer 10 and the second signal metal layer 11 have an area used for shading reduced correspondingly, so that an aperture ratio of the thin film transistor may be increased. In addition, the orthogonal projection of the second signal metal layer 11 on the base substrate 1 is staggered or partially coincident with the orthogonal projection of the first signal metal layer 10 on the base substrate 1, which may further appropriately reduce a capacitance formed as the two signal metal layers are provided opposite to each other, and improve an electrical performance of the thin film transistor, so as to improve a display quality of a display panel where the thin film transistor is located.

In order to simplify a fabrication process of the thin film transistor, in the fabrication method of the thin film transistor provided by the above-described embodiment, the forming an active layer and a second signal metal layer on the base substrate on which the first signal metal layer is formed includes: forming the active layer 4 and the second signal metal layer 11 in one patterning process. The active layer 4 and the second signal metal layer 11 are formed by using one patterning process, which may reduce the total number of patterning processes used in a fabrication procedure of the thin film transistor, simplify the fabrication process of the thin film transistor, and improve a fabrication efficiency of the thin film transistor.

It should be noted that, when the active layer 4 and the second signal metal layer 11 are formed in one patterning process, they may be formed by using a semi-exposure process, wherein, the semi-exposure process includes using a gray tone mask or a half tone mask. Exposure amount of film layers of different regions may be differently adjusted by using, the semi-exposure process, so that the film layers of different regions have different shapes and different thicknesses. Exemplarily, after the active layer 4 and the second signal metal layer 11 are stacked and deposited on the first signal metal layer 10, the active layer 4 and the second signal metal layer 11 are etched with the gray tone mask or the half tone mask, to obtain the active layer 4 and the second signal metal layer 11 staggered in different layers.

Exemplarily, when the active layer 4 and the second signal metal layer 11 are formed, a photoresist layer formed on a layer for forming the active layer 4 and the second signal metal layer 11 may be exposed and developed with the gray lone mask or the half tone mask, to form a photoresist-completely-retained region, a photoresist-partially-retained region, and a photoresist-completely-removed region, wherein, the photoresist-completely-removed region corresponds to a region other than the active layer and the second signal metal layer, the photoresist-completely-retained region corresponds to a formation region of the second signal metal layer, and the photoresist-partially-retained region corresponds to a region of the active layer not covered by the second signal metal layer, for example, the conductive channel formation region, so that after the active layer and the second signal metal layer in the photoresist completely removed region are etched away, the photoresist is asked to expose the second signal metal layer, and the second signal metal layer in the region is etched away, to obtain the region of the active layer not covered by the second signal metal layer, for example, the conductive channel formation region.

Figure 6:
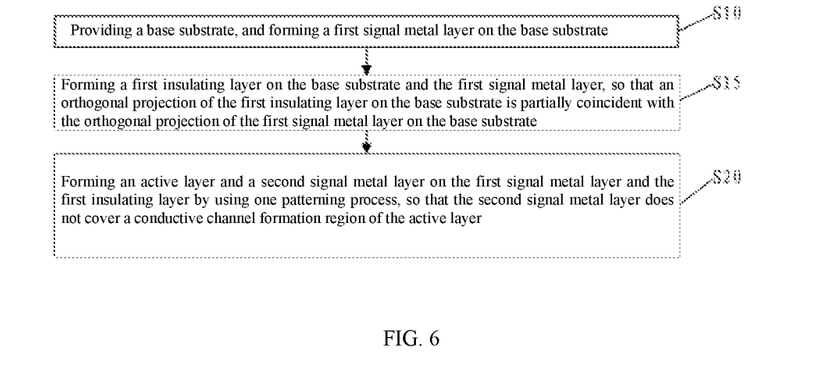
FIG. 6 is a flow chart II of the fabrication method of the thin film transistor provided by an embodiment of the present disclosure.
Figure 9:
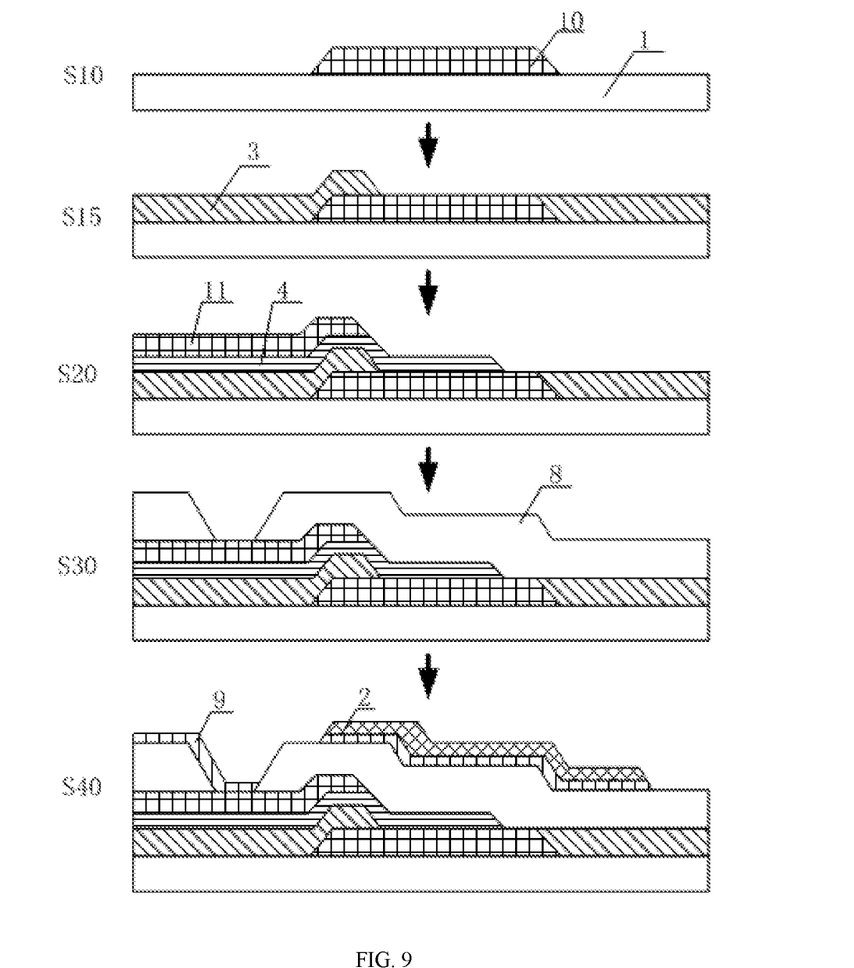
FIG. 9 is a schematic diagram V of the fabrication method of the thin film transistor provided by an embodiment of the present disclosure.

In the above-described embodiment, with reference to FIG. 6 and FIG. 9, the forming a first signal metal layer 10 on the base substrate 1 in S1 includes:

S10: forming the first signal metal layer 10 on the base substrate 1;

S15: forming a first insulating layer 3 on the base substrate 1 and the first signal metal layer 10, so that an orthogonal projection of the first insulating layer 3 on the base substrate 1 is partially coincident with the orthogonal projection of the first signal metal layer 10 on the base substrate 1;

The forming an active layer and a second signal metal layer on the base substrate on which the first signal metal layer is formed includes:

S20: forming the active layer and the second signal metal layer on the base substrate 1 on which the first signal metal layer 10 and the first insulating layer 3 are formed.

Thus, the first insulating layer 3 is formed on the base substrate 1 and the first signal metal layer 10, and the orthogonal projection of the first insulating layer 3 on the base substrate 1 is partially coincident with the orthogonal projection of the first signal metal layer 10 on the base substrate 1, so that a formation structure of the first insulating layer 3, for example, a trapezoidal protrusion of the first insulating layer 3, may be used for supporting and defining as an auxiliary formation of the active layer 4 and the second signal metal layer 11, to ensure that the active layer 4 and the second signal metal layer 11 may be staggered in different layers in one patterning process by using the semi-exposure process.

Figure 7:
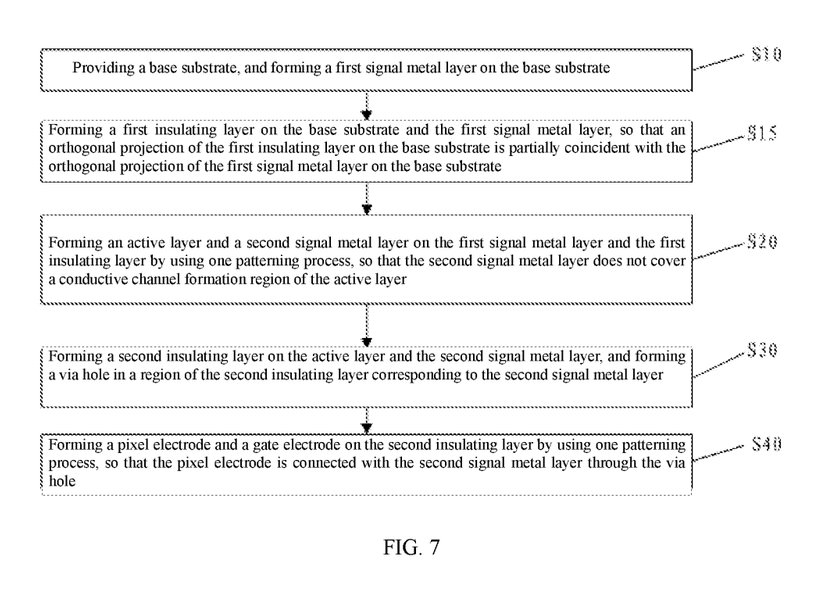
FIG. 7 is a flow chart III of the fabrication method of the thin film transistor provided by an embodiment of the present disclosure.

In order to further simplify the fabrication process of the thin film transistor, with reference to FIG. 7 and FIG. 9, the fabrication method of the thin film transistor provided by the above-described embodiment further comprises:

S30: forming a second insulating layer 8 on the active layer 4 and the second signal metal layer 11, and forming a via hole in a region of the second insulating layer 8 corresponding to the second signal metal layer 11;

S40: forming a pixel electrode 9 and a gate electrode 2 on the second insulating layer 8 by using one patterning process, so that the pixel electrode 9 is connected with the second signal metal layer 11 through the via hole.

The forming the second insulating layer 8 on the active layer 4 and the second signal metal layer 11, may implement insulation of the gate electrode 2 from the active layer 4 and insulation of the gate electrode 2 from the second signal metal layer 11. The forming the pixel electrode 9 and the gate electrode 2 in one patterning process may further reduce the total number of patterning processes used in the fabrication procedure of the thin film transistor, and further simplify the fabrication process of the thin film transistor, so as to improve a fabrication efficiency of the thin film transistor.

It should be noted that, when the pixel electrode 9 and the gate electrode 2 are formed in one patterning process, they may be formed by using the semi-exposure process. Exemplarily, after a pixel electrode layer and a gate electrode metal layer are stacked and deposited on the second insulating layer 8, the pixel electrode layer and the gate electrode metal layer are etched with the gray tone mask or the half tone mask, to obtain the pixel electrode 9 and the gate electrode 2 independent of each other.

It should be added that, when the first insulating layer 3 is formed or the second insulating layer 8 is formed, in consideration of a physical property of an insulating material, it is usually formed by dry etching.

It is worth mentioning that, when the pixel electrode 9 and the gate electrode 2 are formed on the second insulating layer 8 by using one patterning process, the gate electrode 2 is formed on a region of the second insulating layer 8 corresponding to the conductive channel formation region 42 of the active layer 4, so that the orthogonal projection of the gate electrode 2 on the base substrate 1 may cover the orthogonal projection of the conductive channel formation region 42 of the active layer 4 on the base substrate 1. Thus, the gate electrode 2 is located on a side of the second insulating layer 8 facing away from the active layer 4, and the gate electrode 2 may shade light for the conductive channel formation region 42 of the active layer 4, prevent light from entering the conductive channel formation region 42 of the active layer 4 from a side of the active layer 4 facing away from the base substrate 1, and avoid an electrical performance of the conductive channel formation region 42 of the active layer 4 from being affected by illumination, for example, avoid threshold voltage shift of the thin film transistor, so as to improve the electrical performance of the thin film transistor and enhance control stability of the thin film transistor.

Figure 8:
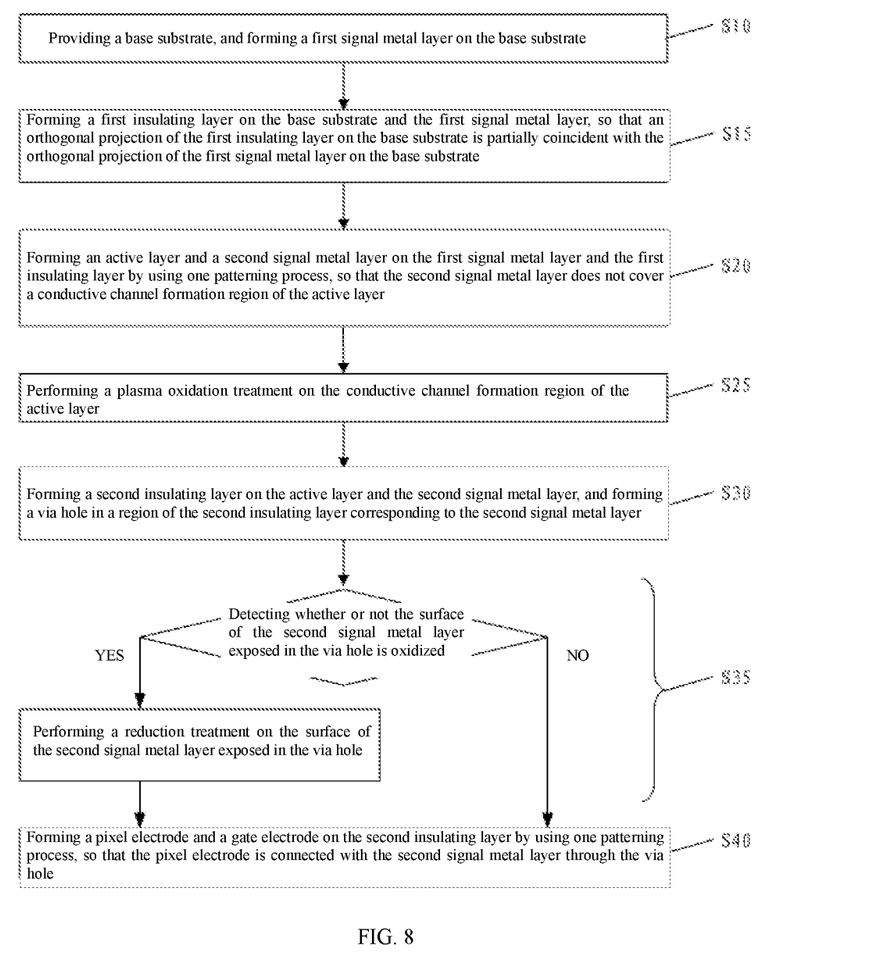
FIG. 8 is a schematic diagram IV of the fabrication method of the thin film transistor provided by an embodiment of the present disclosure.

In order to further improve a yield of the thin film transistor, with reference to FIG. 8 and FIG. 9, the above-described fabrication method of the thin film transistor further comprises:

S25: performing a plasma oxidation treatment on the conductive channel formation region 42 of the active layer 4, after S20;

S35: detecting whether or not the surface of the second signal metal layer 11 exposed in the via hole is oxidized, after S30; if oxidized, performing a reduction treatment on the surface of the second signal metal layer 11 exposed in the via hole, and then executing S40; if not oxidized, executing S40.

Usually, in order to enhance stability in the use of the thin film transistor, it is necessary to perform the plasma oxidation treatment on the conductive channel formation region 42 of the active layer 4; wherein, the most common plasma oxidation mode is a plasma deposition mode. However, since the second signal metal layer 11 is formed on the active layer 4, when the conductive channel formation region 42 of the active layer 4 is subjected to the plasma oxidation treatment, the second signal metal layer 11 is also at the risk of being oxidized; and therefore, after the via hole is formed in the region of the second insulating layer 8 corresponding to the second signal metal layer 11, it will be detected whether or not the surface of the second signal metal layer 11 exposed in the via hole is oxidized, that is, whether or not the surface of the second signal metal layer 13 for being connected with the pixel electrode 9 is oxidized; then it is subjected to a reduction treatment when it is oxidized, which may ensure that after the pixel electrode 9 is formed on the second insulating layer 8 subsequently, the pixel electrode 9 and the second signal metal layer 11 maintain good connection with each other, which is conducive to further improvement of the yield of thin film transistor.

It may be understood that, in the above-described embodiment, there may be various modes for performing the reduction treatment on the surface of the second signal metal layer 11 exposed in the via hole, for example, performing a reduction reaction with a reducing agent, the reducing agent including hydrogen gas, carbon monoxide, charcoal, and the like, which may be set by those skilled in the art as actually required. In this embodiment, a hydrogen plasma reduction treatment is preferred.

An embodiment of the present disclosure further provides an array substrate, the array substrate comprising the thin film transistor provided by the above-described embodiment. The thin film transistor in the array substrate has the same advantages as the thin film transistor according to the above-described embodiment, which will not be repeated here.

What are described above is related to the specific embodiments of the disclosure only and not limitative to the scope of the disclosure. Any modification and equivalent replacement may be made by those skilled in the art within the substantial protection scope of the embodiments of the present disclosure, which is regarded as falling within the protection scope of embodiments of the present disclosure. The protection scope of the disclosure shall be based on the protection scope of the claims.

The present application claims priority of Chinese Patent Application No. 201710392164.7 filed on May 27, 2017, the disclosure of which is incorporated herein by reference in its entirety as part of the present application.

The invention claimed is:

1. A thin film transistor, formed on a base substrate, the thin film transistor comprising:
an active layer;
a first signal metal layer, provided on a surface of the active layer facing the base substrate;
a second signal metal layer, provided on a surface of the active layer facing away from the first signal metal layer,
wherein, the active layer includes a conductive channel formation region, and the second signal metal layer does not cover the conductive channel formation region of the active layer,
wherein the active layer includes a first base region, a second base region, and the conductive channel formation region located between the first base region and the second base region, an orthogonal projection of the first base region, an orthogonal projection of the second base region and an orthogonal projection of the conductive channel formation region on the base substrate are not overlapped with each other, the conductive channel formation region is a region of the active layer being subject to a plasma oxidation treatment, the conductive channel formation region directly fully contacts with the first signal metal layer in a channel length direction,
wherein the first base region of the active layer directly contacts with the first signal metal layer,
wherein the thin film transistor further comprises:
a gate electrode, provided on a side of the active layer opposite to the base substrate;
a second insulating layer, provided between the active layer and the gate electrode, between the first signal metal layer and the gate electrode, and between the second signal metal layer and the gate electrode,
wherein a via hole is provided in a region of the second insulating layer corresponding to the second signal metal layer, and a pixel electrode is disposed on the second insulating layer, an orthogonal projection of a portion of the pixel electrode which directly contacts with the second signal metal layer overlaps with an orthogonal projection of the active layer formed on the base substrate,
the gate electrode has a double-layer structure and comprises two layers, orthogonal projections of the two layers coincide and a first sub-layer of the two layers is provided in a same layer as the pixel electrode and is located at a side of the gate electrode close to the base substrate, and the pixel electrode is connected with the second signal metal layer through the via hole,
wherein all portions of the second signal metal layer which are connected with the pixel electrode directly contact with the active layer, the all portions of the second signal metal layer are conformal with a portion of the active layer which directly contacts with the second signal metal layer,
wherein the two layers of the gate electrode are conformal, and sizes of the orthogonal projections of the two layers of the gate electrode are identical and shapes of the orthogonal projections of the two layers of the gate electrode are identical, the first base region, the second base region and the conductive channel formation region of the active layer are arranged along a parallel direction parallel to a plane where the substrate is located, the first base region is located at a right side of the conductive channel formation region in the parallel direction and directly contacts the first signal metal layer, the second base region is located at a left side of the conductive channel formation region in the parallel direction and directly contacts the second signal metal layer.

2. The thin film transistor according to claim 1, wherein, an orthogonal projection of the first signal metal layer on the base substrate is located on a side of an orthogonal projection of the conductive channel formation region on the base substrate.

3. The thin film transistor according to claim 2, wherein, the orthogonal projection of the first signal metal layer on the base substrate is staggered or partially coincident with an orthogonal projection of the second signal metal layer on the base substrate.

4. The thin film transistor according to claim 1, wherein, a first insulating layer is provided between the active layer and the base substrate, and the first insulating layer is provided in a same layer as the first signal metal layer.

5. The thin film transistor according to claim 1, wherein, the gate electrode is located on a side of the second insulating layer facing away from the active layer, and an orthogonal projection of the gate electrode on the base substrate covers the orthogonal projection of the conductive channel formation region of the active layer on the base substrate.

6. The thin film transistor according to claim 1, wherein, the first signal metal layer is a source electrode, and the second signal metal layer is a drain electrode; or, the first signal metal layer is a drain electrode, and the second signal metal layer is a source electrode.

7. A fabrication method of a thin film transistor, comprising:
providing a base substrate, and forming a first signal metal layer on the base substrate;
forming an active layer and a second signal metal layer on the base substrate on which the first signal metal layer is formed, wherein, the second signal metal layer is provided on a surface of the active layer facing away from the first signal metal layer, and the second signal metal layer does not cover a conductive channel formation region of the active layer,
wherein the active layer includes a first base region, a second base region, and the conductive channel formation region located between the first base region and the second base region, an orthogonal projection of the first base region, an orthogonal projection of the second base region and an orthogonal projection of the conductive channel formation region on the base substrate are not overlapped with each other, the conductive channel formation region is a region of the active layer being subject to a plasma oxidation treatment, the conductive channel formation region directly fully contacts with the first signal metal layer in a channel length direction,
wherein the fabrication method of the thin film transistor further comprises:
forming a second insulating layer on the active layer and the second signal metal layer, and forming a via hole in a region of the second insulating layer corresponding to the second signal metal layer; and
forming a pixel electrode and a gate electrode on the second insulating layer by using one patterning process, so that the pixel electrode is connected with the second signal metal layer through the via hole,
wherein the first base region of the active layer directly contacts with the first signal metal layer,
wherein an orthogonal projection of a portion of the pixel electrode which directly contacts with the second signal metal layer overlaps with an orthogonal projection of the active layer formed on the base substrate,
the gate electrode has a double-layer structure and comprises two layers, orthogonal projections of the two layers coincide and a first sub-layer of the two layers is provided in a same layer as the pixel electrode and is located at a side of the gate electrode close to the base substrate, and the pixel electrode is connected with the second signal metal layer through the via hole,
wherein all portions of the second signal metal layer directly contact with the active layer, the all portions of the second signal metal layer are conformal with a portion of the active layer which directly contacts with the second signal metal layer,
wherein the two layers of the gate electrode are conformal, and sizes of the orthogonal projections of the two layers of the gate electrode are identical and shapes of the orthogonal projections of the two layers of the gate electrode are identical, the first base region, the second base region and the conductive channel formation region of the active layer are arranged along a parallel direction parallel to a plane where the substrate is located, the first base region is located at a right side of the conductive channel formation region in the parallel direction and directly contacts the first signal metal layer, the second base region is located at a left side of the conductive channel formation region in the parallel direction and directly contacts the second signal metal layer.

8. The fabrication method of the thin film transistor according to claim 7, wherein, an orthogonal projection of the first signal metal layer on the base substrate is located on a side of an orthogonal projection of the conductive channel formation region on the base substrate.

9. The fabrication method of the thin film transistor according to claim 8, wherein, when the second signal metal layer is formed on the surface of the active layer facing away from the first signal metal layer, the second signal metal layer is formed such that an orthogonal projection of the second signal metal layer on the base substrate is staggered or partially coincident with the orthogonal projection of the first signal metal layer on the base substrate.

10. The fabrication method of the thin film transistor according to claim 9, wherein, the forming a first signal metal layer on the base substrate includes:
forming the first signal metal layer on the base substrate;
forming a first insulating layer on the base substrate and the first signal metal layer, so that an orthogonal projection of the first insulating layer on the base substrate is partially coincident with the orthogonal projection of the first signal metal layer on the base substrate;
the forming an active layer and a second signal metal layer on the base substrate on which the first signal metal layer is formed includes:
forming the active layer and the second signal metal layer on the base substrate on which the first signal metal layer and the first insulating layer are formed.

11. The fabrication method of the thin film transistor according to claim 8, wherein, the forming an active layer and a second signal metal layer on the base substrate on which the first signal metal layer is formed includes:
forming the active layer and the second signal metal layer in one patterning process.

12. The fabrication method of the thin film transistor according to claim 11, wherein, the forming a first signal metal layer on the base substrate includes:

forming the first signal metal layer on the base substrate;

forming a first insulating layer on the base substrate and the first signal metal layer, so that an orthogonal projection of the first insulating layer on the base substrate is partially coincident with the orthogonal projection of the first signal metal layer on the base substrate;

the forming an active layer and a second signal metal layer on the base substrate on which the first signal metal layer is formed includes:

forming the active layer and the second signal metal layer on the base substrate on which the first signal metal layer and the first insulating layer are formed.

13. The fabrication method of the thin film transistor according to claim 8, wherein, the forming a first signal metal layer on the base substrate includes:

forming the first signal metal layer on the base substrate;

forming a first insulating layer on the base substrate and the first signal metal layer, so that an orthogonal projection of the first insulating layer on the base substrate is partially coincident with the orthogonal projection of the first signal metal layer on the base substrate;

the forming an active layer and a second signal metal layer on the base substrate on which the first signal metal layer is formed includes:

forming the active layer and the second signal metal layer on the base substrate on which the first signal metal layer and the first insulating layer are formed.

14. The fabrication method of the thin film transistor according to claim 7, wherein, the forming a first signal metal layer on the base substrate includes:

forming the first signal metal layer on the base substrate;

forming a first insulating layer on the base substrate and the first signal metal layer, so that an orthogonal projection of the first insulating layer on the base substrate is partially coincident with the orthogonal projection of the first signal metal layer on the base substrate;

the forming an active layer and a second signal metal layer on the base substrate on which the first signal metal layer is formed includes:

forming the active layer and the second signal metal layer on the base substrate on which the first signal metal layer and the first insulating layer are formed.

15. The fabrication method of the thin film transistor according to claim 7, wherein, when the pixel electrode and the gate electrode are formed on the second insulating layer by using one patterning process, the gate electrode is formed on a region of the second insulating layer corresponding to the conductive channel formation region, so that an orthogonal projection of the gate electrode on the base substrate covers the orthogonal projection of the conductive channel formation region of the active layer on the base substrate.

16. The fabrication method of the thin film transistor according to claim 7, further comprising:

performing a plasma oxidation treatment on the conductive channel formation region of the active layer, after forming the active layer and the second signal metal layer on the base substrate on which the first signal metal layer is formed; and detecting whether or not a surface of the second signal metal layer exposed in the via hole is oxidized, after forming the via hole in the region of the second insulating layer corresponding to the second signal metal layer; if oxidized, performing a reduction treatment on the surface of the second signal metal layer exposed in the via hole, and then forming the pixel electrode and the gate electrode on the second insulating layer by using one patterning process; if not oxidized, forming the pixel electrode and the gate electrode on the second insulating layer by using one patterning process.

17. An array substrate, comprising the thin film transistor according to claim 1.

* * * * *